(12) United States Patent
Tan et al.

(10) Patent No.: US 12,133,340 B2
(45) Date of Patent: Oct. 29, 2024

(54) CASING ASSEMBLY AND ELECTRONIC DEVICE INCLUDING THE SAME

(71) Applicant: WISTRON CORP., New Taipei (TW)

(72) Inventors: Siyun Tan, New Taipei (TW); Yisheng Chen, New Taipei (TW); Chia-Hsin Liu, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 17/823,113

(22) Filed: Aug. 30, 2022

(65) Prior Publication Data

US 2023/0269886 A1 Aug. 24, 2023

(30) Foreign Application Priority Data

Feb. 22, 2022 (CN) .......................... 202210163143.9

(51) Int. Cl.
*H05K 5/00* (2006.01)
*H05K 5/02* (2006.01)

(52) U.S. Cl.
CPC ......... *H05K 5/0021* (2013.01); *H05K 5/0221* (2013.01); *H05K 5/023* (2013.01)

(58) Field of Classification Search
CPC ...................................................... H05K 5/00
See application file for complete search history.

(56) References Cited

U.S. PATENT DOCUMENTS

| 10,901,457 | B2 | 1/2021 | Ou et al. | |
| 11,011,872 | B2 | 5/2021 | Fu | |
| 2014/0044480 | A1* | 2/2014 | Crippen | H05K 7/1487 |
| | | | | 403/322.4 |
| 2020/0077537 | A1* | 3/2020 | Leung | H05K 7/1409 |
| 2021/0360095 | A1* | 11/2021 | Liao | H04N 23/57 |

FOREIGN PATENT DOCUMENTS

CN          209514521 U     10/2019

OTHER PUBLICATIONS

TW Office Action dated Dec. 26, 2022 in Taiwan application No. 111110772.

* cited by examiner

*Primary Examiner* — Jerry Wu
(74) *Attorney, Agent, or Firm* — McClure, Qualey & Rodack, LLP

(57) ABSTRACT

A casing assembly adapted for a carrier and comprising a casing adapted to be stacked on the carrier and a latch mechanism comprising a first component, a second component, and a third component. The first component and the second component are movable by each other and are rotatably disposed on the casing, the third component is slidably disposed on the casing and movable by the second component, such that the third component is releasably engaged with a first engaging component of the carrier as the first component moves the second component.

18 Claims, 17 Drawing Sheets

CASING ASSEMBLY AND ELECTRONIC
DEVICE INCLUDING THE SAME

CROSS-REFERENCE TO RELATED
APPLICATIONS

This non-provisional application claims priority under 35 U.S.C. § 119(a) on Patent Application No(s). 202210163143.9 filed in China on Feb. 22, 2022, the entire contents of which are hereby incorporated by reference.

TECHNICAL FIELD

The disclosure relates to a fixing mechanism, more particularly to a casing assembly and an electronic device including the same.

BACKGROUND

A computer or server rack may contain one or more detachable carriers for achieving effective and flexible utilization of internal space. Taking a tray that is suitable to be stacked on a server chassis as an example, the tray is detachable and provided to support or accommodate circuit boards and other associated devices or modules, such that chosen devices or modules are allowed to be efficiently and quickly placed to the upper area of the chassis.

It is known that a typical tray can be held in position by being pressed by a top cover installed on the chassis, but the top cover is unable and often fails to secure the position of the tray. As a result, the tray and the devices or modules thereon are easily displaced due to external force or impact. Using fasteners, such as screws, to fix the tray is an existing option for this problem, but it leads to troublesome and time-consuming installation and removal steps.

SUMMARY

Accordingly, one aspect of the disclosure is to provide a casing assembly and an electronic device including the same which enable convenient and efficient fixation steps.

One embodiment of the disclosure provides a casing assembly adapted for a carrier and comprising a casing adapted to be stacked on the carrier and a latch mechanism comprising a first component, a second component, and a third component. The first component and the second component are movable by each other and are rotatably disposed on the casing, the third component is slidably disposed on the casing and movable by the second component, such that the third component is releasably engaged with a first engaging component of the carrier as the first component moves the second component.

Another embodiment of the disclosure provides an electronic device comprising a carrier with a first engaging component thereon and a casing assembly comprising a casing and a latch mechanism, the casing is adapted to be stacked on the carrier, the latch mechanism comprises a first component, a second component, and a third component, the first component and the second component are movable by each other and are rotatably disposed on the casing, the third component is slidably disposed on the casing and movable by the second component, such that the third component is releasably engaged with the first engaging component of the carrier as the first component moves the second component.

According to the casing assembly and the electronic device as discussed in the above embodiments of the disclosure, since the first component is able to cause the third component to engage with the first engaging component of the carrier by moving the second component, the second and third components can be served as an extension for the motion of the first component. This allows the user to operate the first component at a reachable location to cause the third component that is not reachable by fingers to build a connection with the carrier, thereby providing a specific area of the casing with a support from the carrier. As such, the latch mechanism not only enables an efficient and tooleless installation and removal of the casing but is also beneficial to prevent the casing from displaced or deformed due to impact, vibration, its weight or load thereon, thereby achieving a convenient operation while ensuring the installation stability of the devices or modules being supported on the casing.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. Unless specified or limited otherwise, the terms "mounted," "connected," and variations thereof are used broadly and encompass both direct and indirect mountings and connections. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities.

Figure 1:
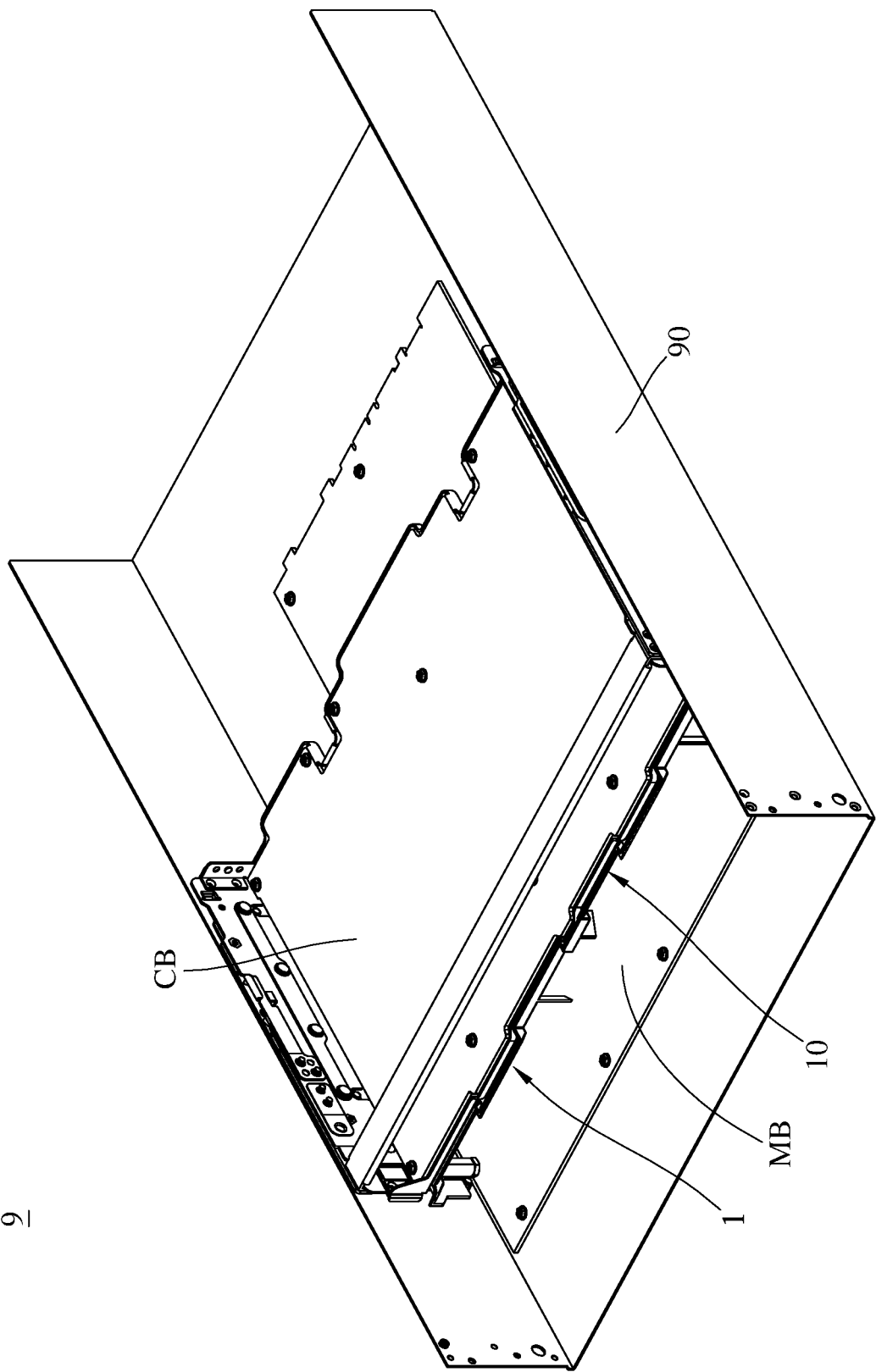
FIG. 1 is a perspective view of an electronic device according to one embodiment of the disclosure.

Please refer to FIG. 1, one embodiment of the disclosure provides an electronic device 9. The electronic device 9 may be, but is not limited to, a desktop computer, a server, or part of any one thereof, but the disclosure is not limited thereto. As shown, the electronic device 9 may include a carrier 90 and a casing assembly 1. The carrier 90 is configured to support or accommodate the casing assembly 1. The carrier 90 may support any other associated electronic component, assembly, casing, or frame structure, such as a mainboard MB shown in the drawings. The casing assembly 1 is detachably installed or stacked on the carrier 90. The casing assembly 1 is configured to support or accommodate any suitable electronic unit or module for required function, such as a circuit board CB shown in the drawings. Note that the carrier 90, the mainboard MB, and the circuit board CB are provided for a better understanding of the casing assembly 1 but are not intended to limit the disclosure in any aspect.

Figure 2:
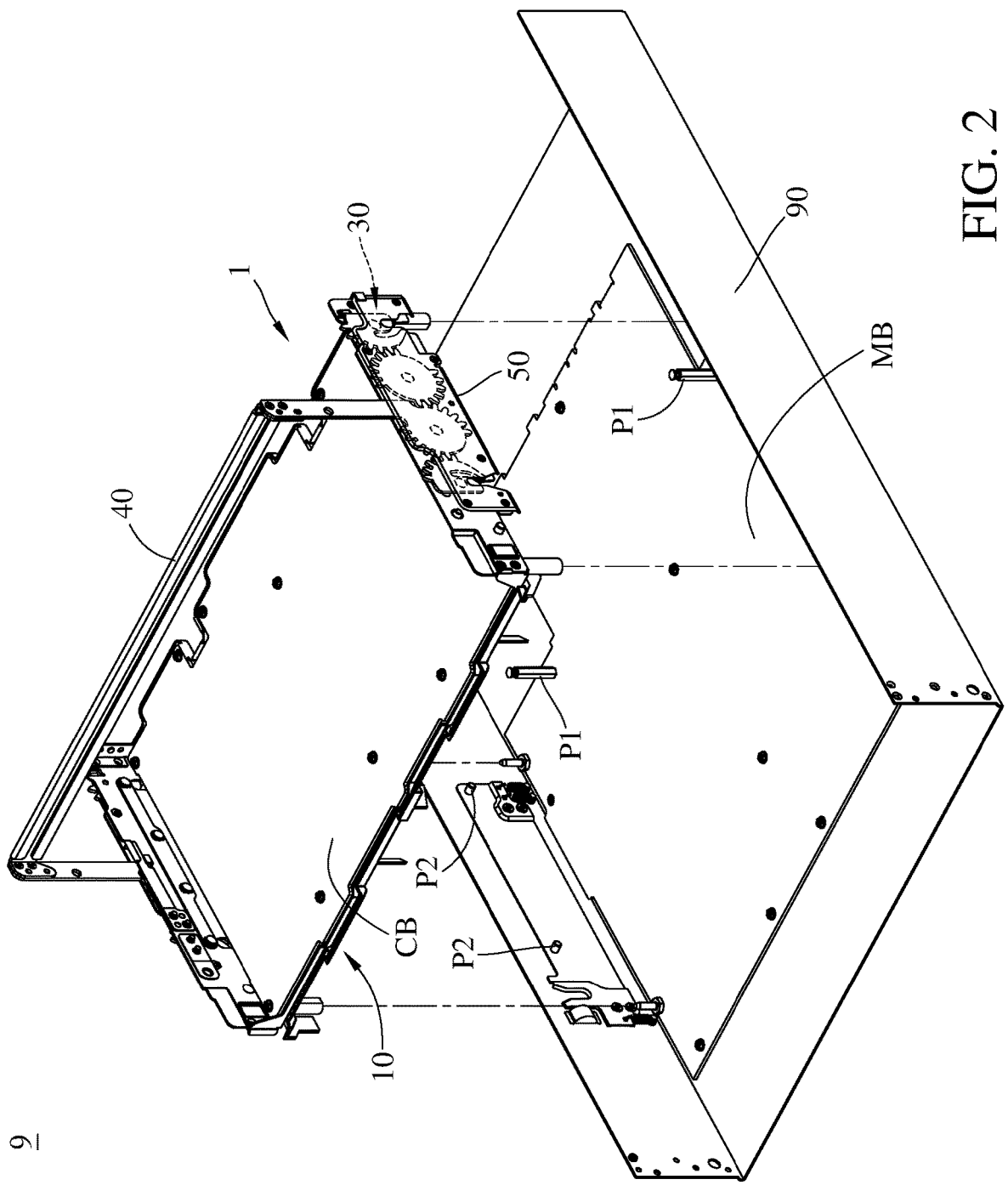
FIG. 2 is an exploded view of a carrier and a casing assembly of the electronic device according to one embodiment of the disclosure.
Figure 3:
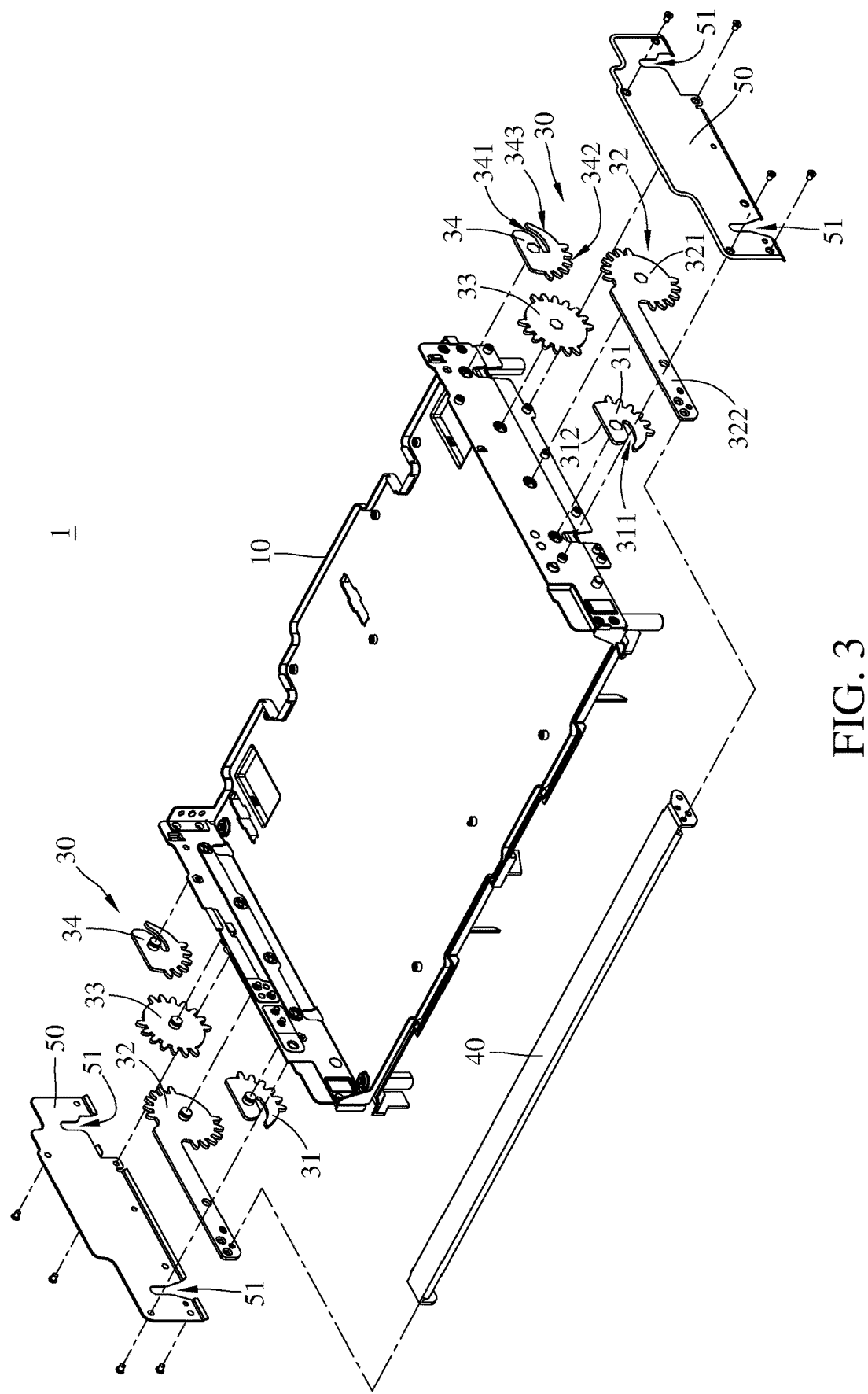
FIG. 3 is an exploded view of the casing assembly according to one embodiment of the disclosure.
Figure 4:
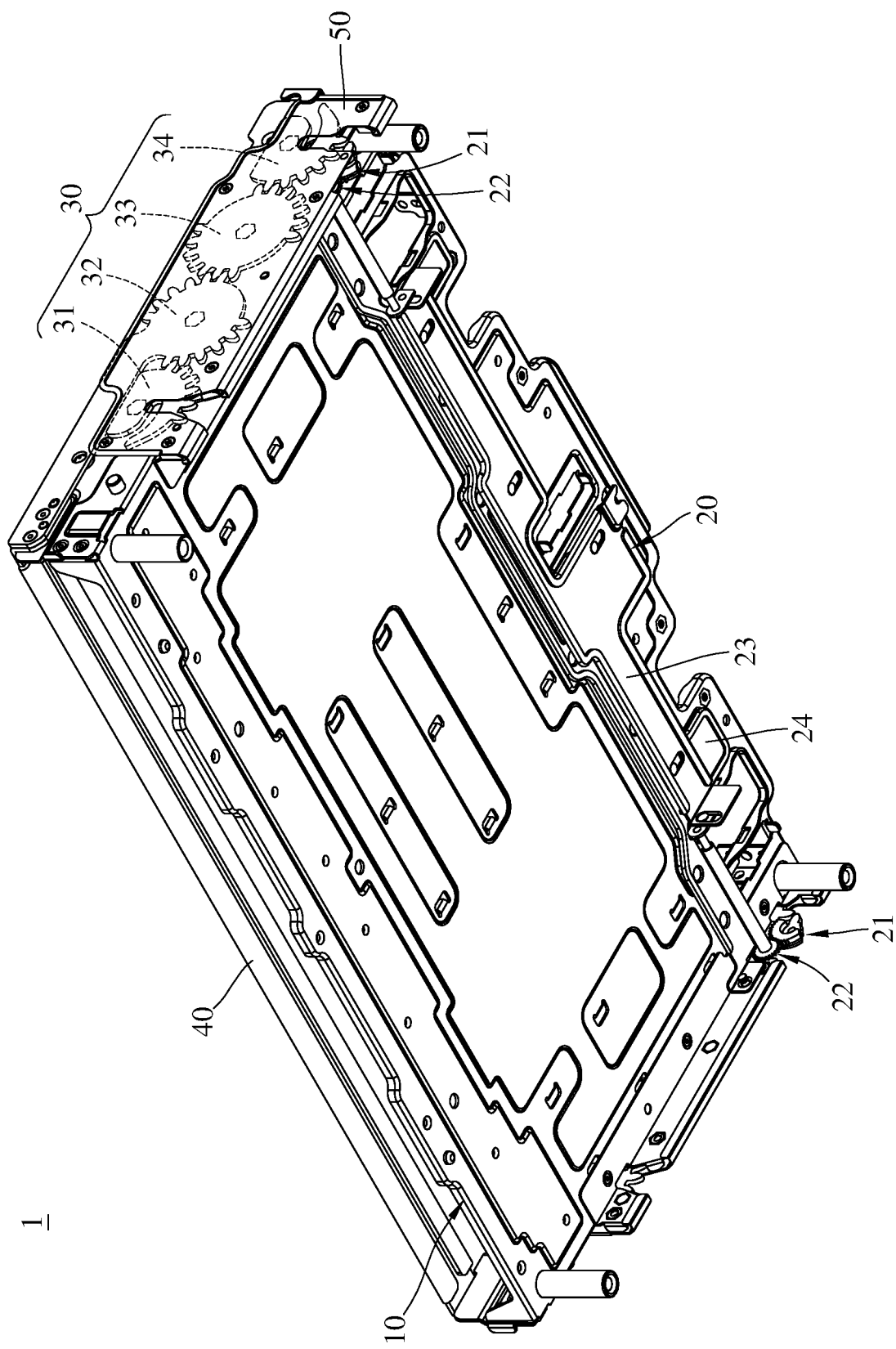
FIG. 4 is a perspective view of the casing assembly according to one embodiment of the disclosure.
Figure 5:
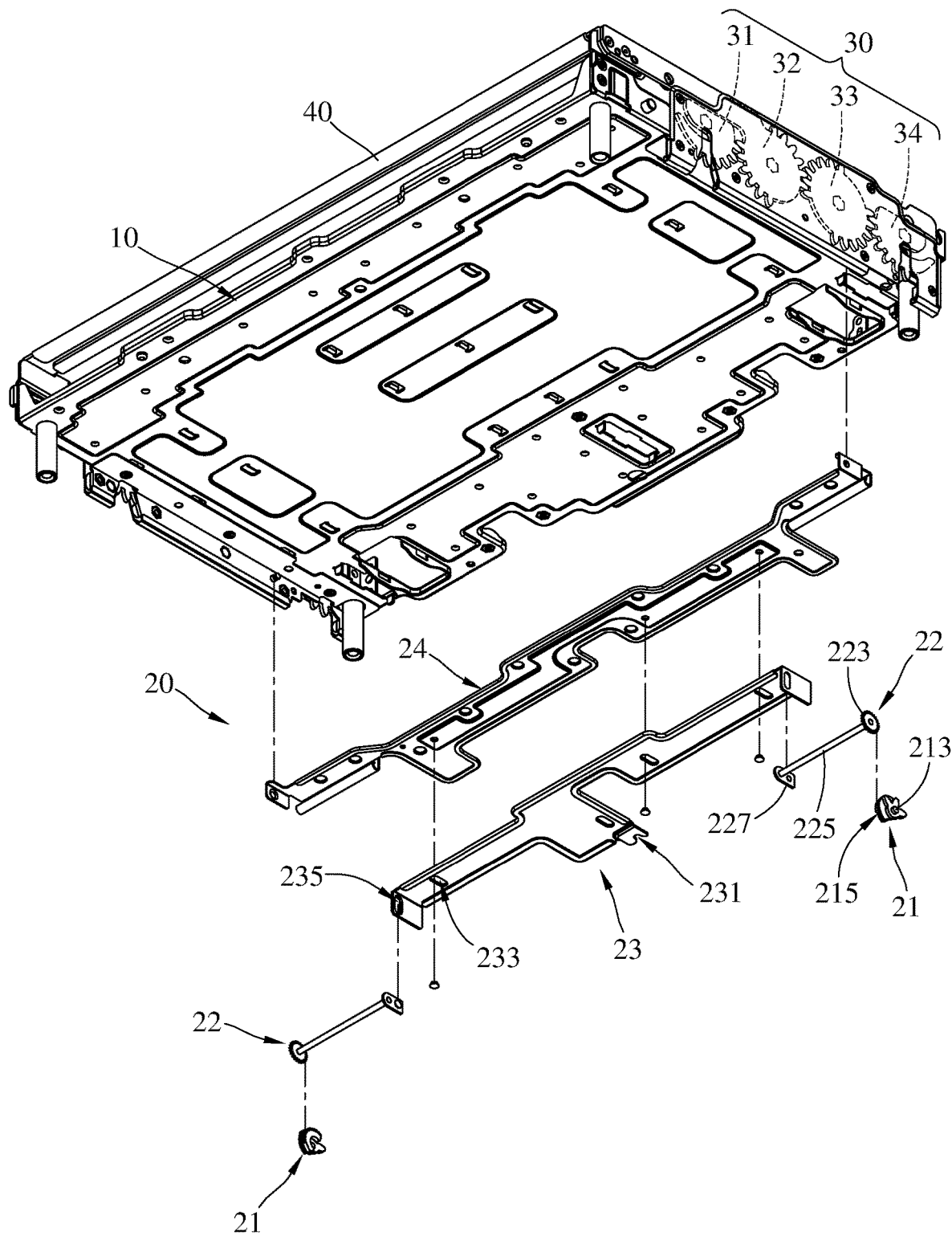
FIG. 5 is another exploded view of the casing assembly according to one embodiment of the disclosure.
Figure 6:
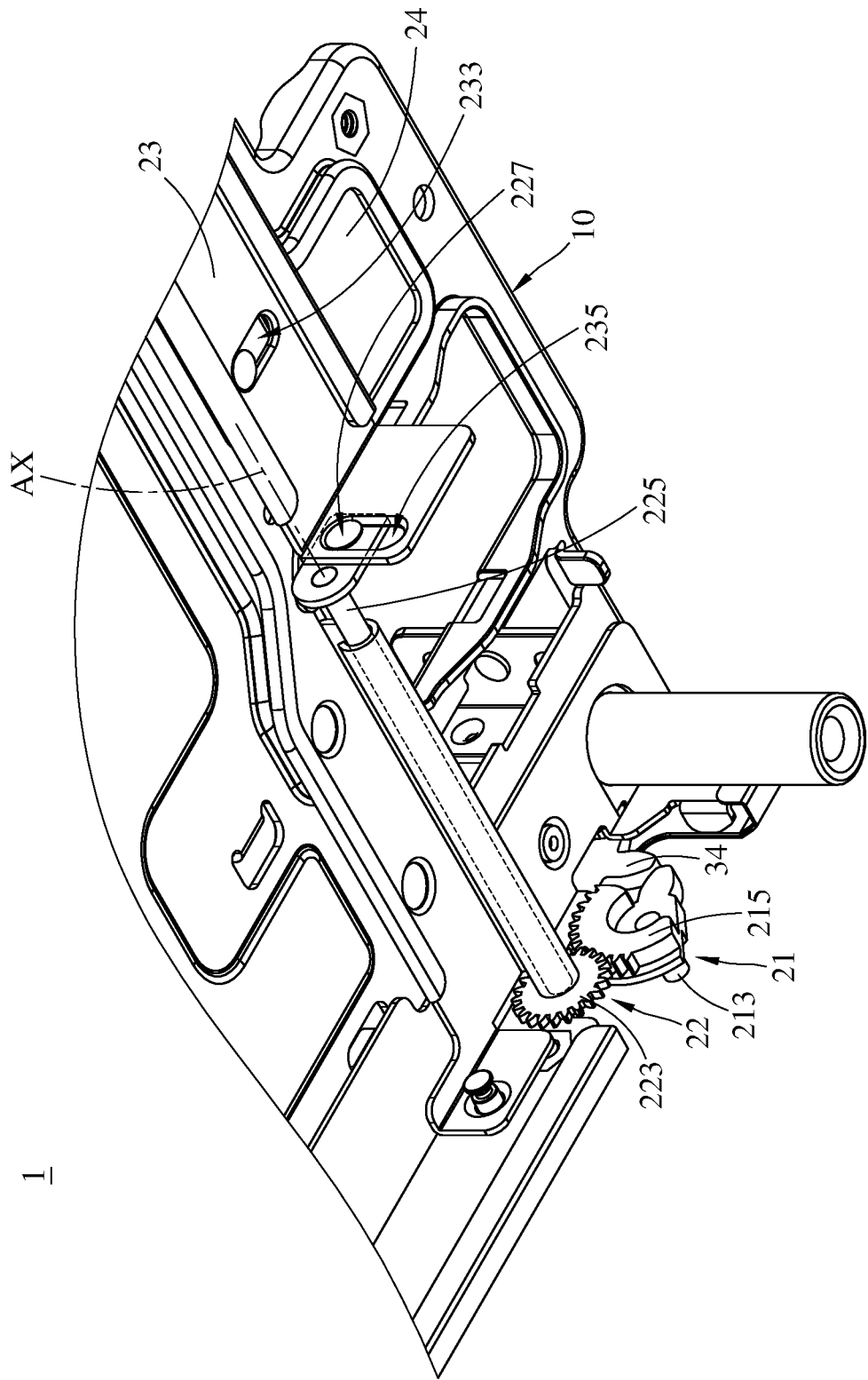
FIG. 6 is a partially enlarged view of the casing assembly according to one embodiment of the disclosure.

The detail of the casing assembly 1 is provided below with further reference to FIGS. 2-6, wherein FIG. 2 is an exploded view of the casing assembly 1 and the carrier 90, FIG. 3 is an exploded view of the casing assembly 1, FIG. 4 is a perspective view of the casing assembly 1, FIG. 5 is another exploded view of the casing assembly 1, and FIG. 6 is a partially enlarged view of the casing assembly 1.

Figure 7:
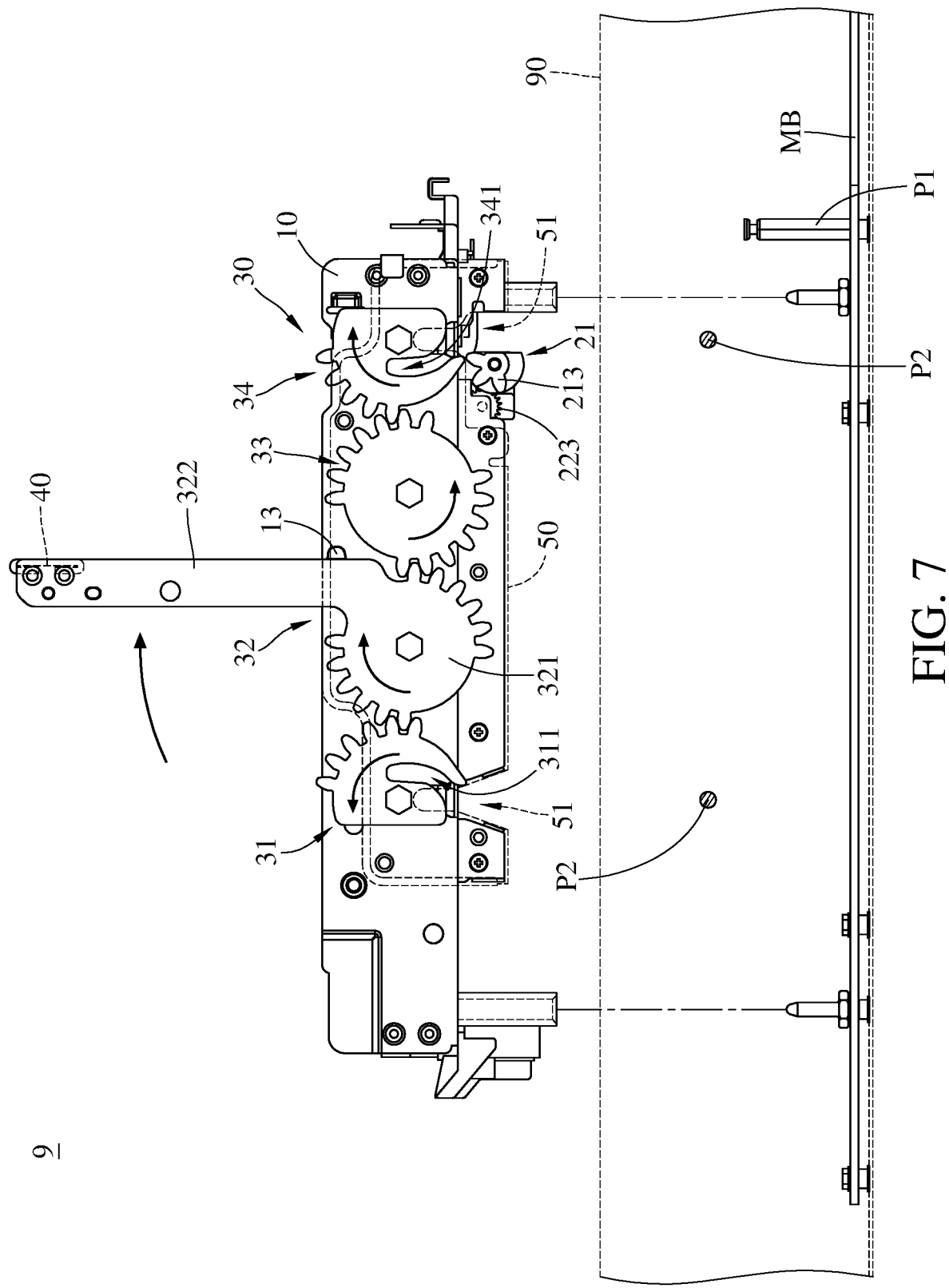
FIG. 7 is an exploded side view of the carrier and the casing assembly of the electronic device according to one embodiment of the disclosure.
Figure 11:
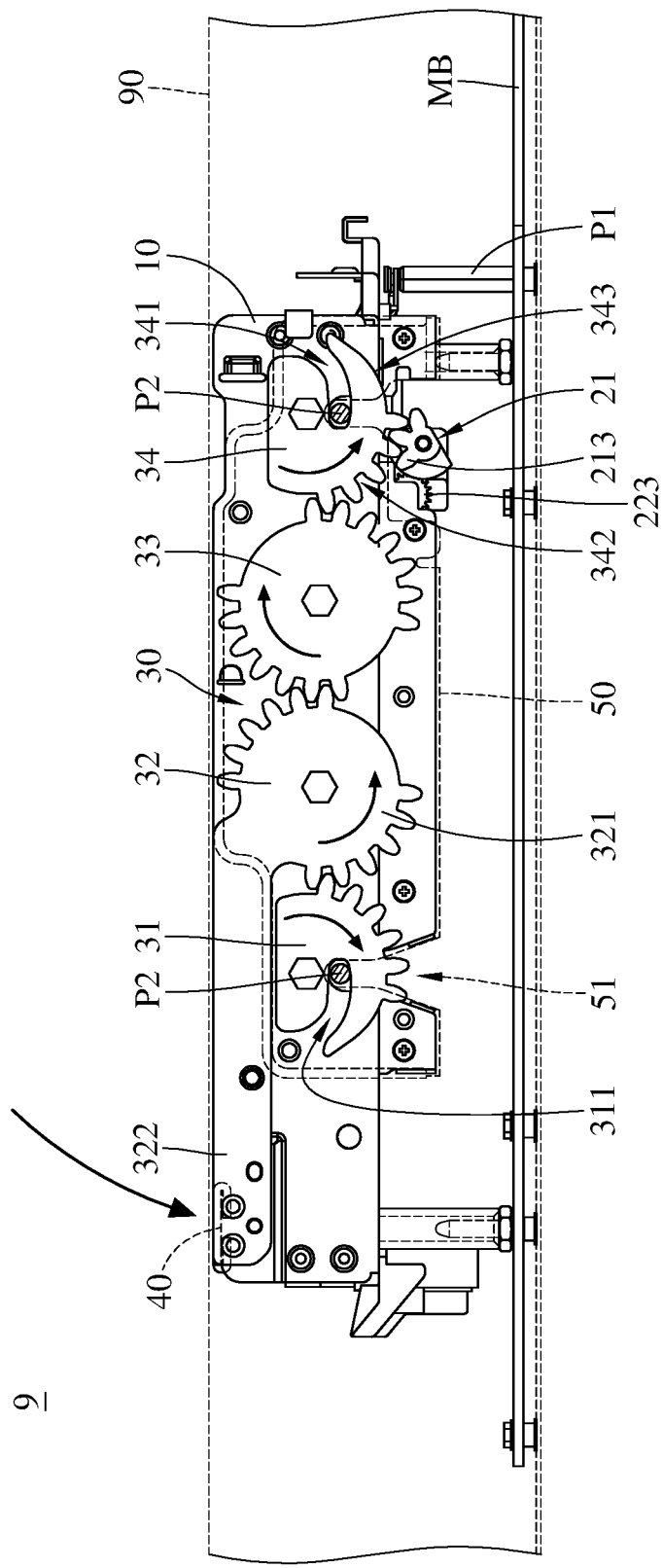
FIG. 11 is a side view of the electronic device according to one embodiment of the disclosure when the handle of the casing assembly is in the lying position.

As shown, the casing assembly 1 may include a casing 10, a latch mechanism 20, at least one gear set 30, a handle 40, and at least one side cover 50. The latch mechanism 20, the gear set 30, the side cover 50, and the circuit board CB are all disposed on the casing 10. The gear set 30 and at least part of the latch mechanism 20 are respectively movably disposed at different sides of the casing 10. The latch mechanism 20 is movable by the gear set 30. The latch mechanism 20 extends toward the bottom side of the casing 10 from two opposite sides of the casing 10. The casing assembly 1 may include two gear sets 30 respectively movably disposed at the two opposite side of the casing 10 and are respectively connected to two opposite ends of the latch mechanism 20, such that the gear sets 30 are able to cause the latch mechanism 20 to move. The handle 40 is rotatably connected to the casing 10 by two opposite ends thereof connected to the gear sets 30. The handle 40 is pivotable with respect to the casing 10 and has a standing position (as shown in FIG. 2 or FIG. 7 discussed in later paragraphs) and a lying position (as shown in FIG. 11 discussed in later paragraphs). The side cover 50 is disposed at the side of the gear set 30 opposite to the casing 10.

In such an arrangement, the user is allowed to move the latch mechanism 20 via the gear sets by switching the position of the handle 40. When the handle 40 is moved towards the specific position, the handle 40 causes the latch mechanism 20 and the gear set 30 to respectively engage a first engaging component P1 and a second engaging component P2 on the casing 10. The first engaging component P1 may be a protrusion protruding inwards from an inner wall of the casing 10. For example, the first engaging component P1 may be a protrusion fixed at and protruding upwards from a bottom plate (not numbered) of the carrier 90. Specifically, the first engaging component P1 may be a screw or bolt used to fix the mainboard MB to the carrier 90. The second engaging component P2 may be a protrusion protruding inwards from another inner wall of the casing 10. For example, the second engaging component P2 may be a protrusion fixed at and protruding inwards from a side plate (not numbered) of the carrier 90.

The details of the latch mechanism 20 and the gear set 30 are given below. In this embodiment, the latch mechanism 20 may include at least three or more independent pieces which are movable by one another. As shown, the latch mechanism 20 may include at least one first component 21, at least one second component 22, and a third component 23. In one embodiment, the latch mechanism 20 may include two pairs of the first component 21 and second component 22 respectively arranged at two opposite sides of the third component 23 and respectively connected to the gear sets 30 at different sides of the casing 10. These two pairs of the first component 21 and second component 22 are the same or similar in configuration, thus only one pair of the first component 21 and second component 22 will be exemplarily described in detail in the following paragraphs.

The first component 21 is rotatably disposed on the casing 10 in any suitable manner. The first component 21 is the part of the latch mechanism 20 that is served to directly engage with the gear set 30 so as to receive force from the gear set 30. The second component 22 is rotatably disposed on the casing 10 in any suitable manner. Optionally, the second component 22 is rotatably disposed on a fourth component 24 which is disposed on the casing 10, where the fourth component 24 may be but not limited to be a piece assembled to the casing 10 in any suitable manner or integrally formed on the casing 10. One end of the second component 22 is connected to a side of the first component 21 so that the second component 22 and the first component 21 are movable by each other. The third component 23 is slidably disposed on the casing 10 in any suitable manner.

Optionally, the third component 23 may be slidably disposed on the casing 10 via the fourth component 24. In some other embodiments, the third component may be directly disposed on the casing. The third component 23 is connected to the other end of the second component 22 so that the second component 22 and the third component 23 are movable by each other.

Figure 10:
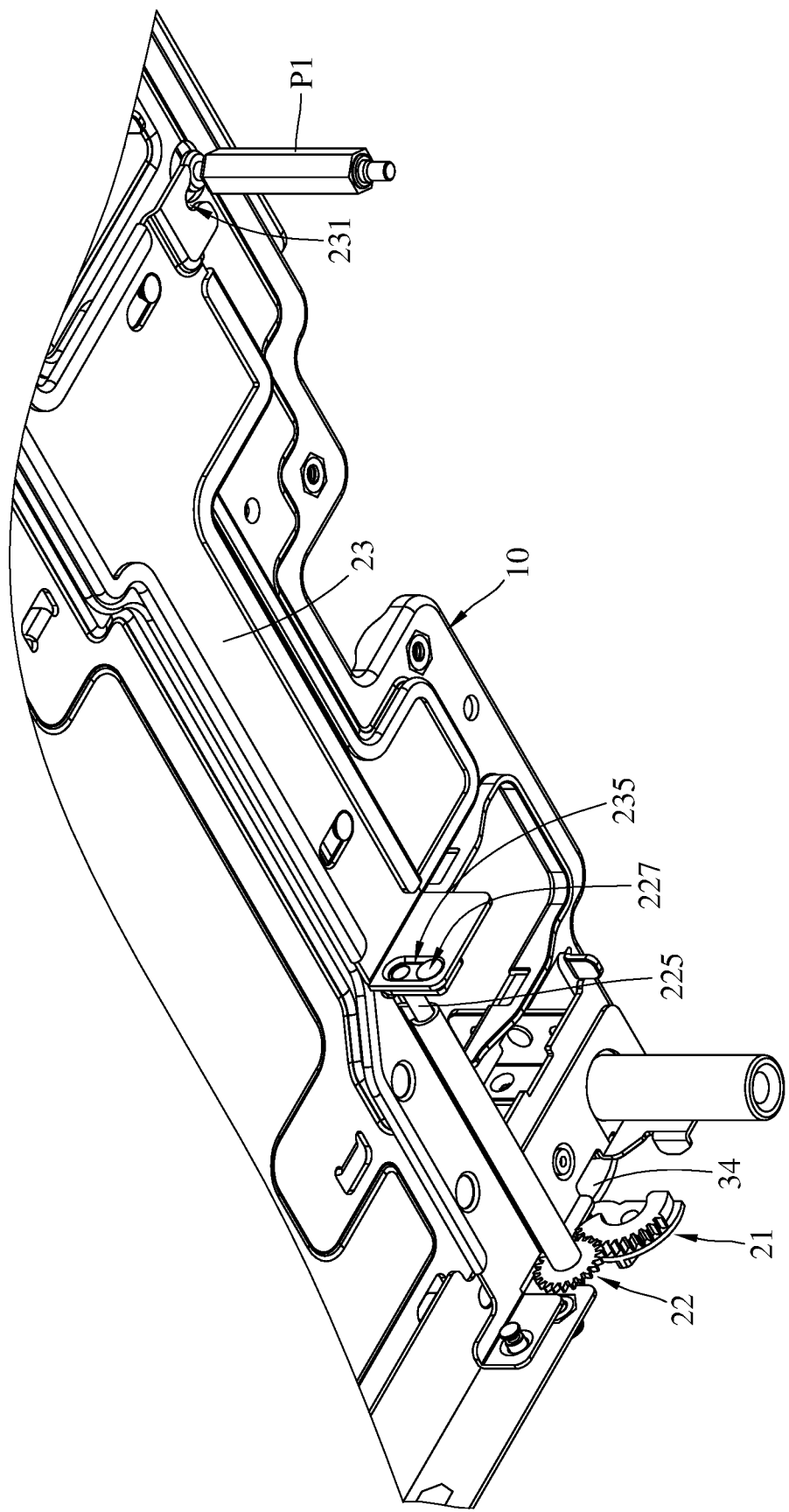
FIG. 10 is a partially enlarged perspective view of the casing assembly in FIG. 9.
Figure 12:
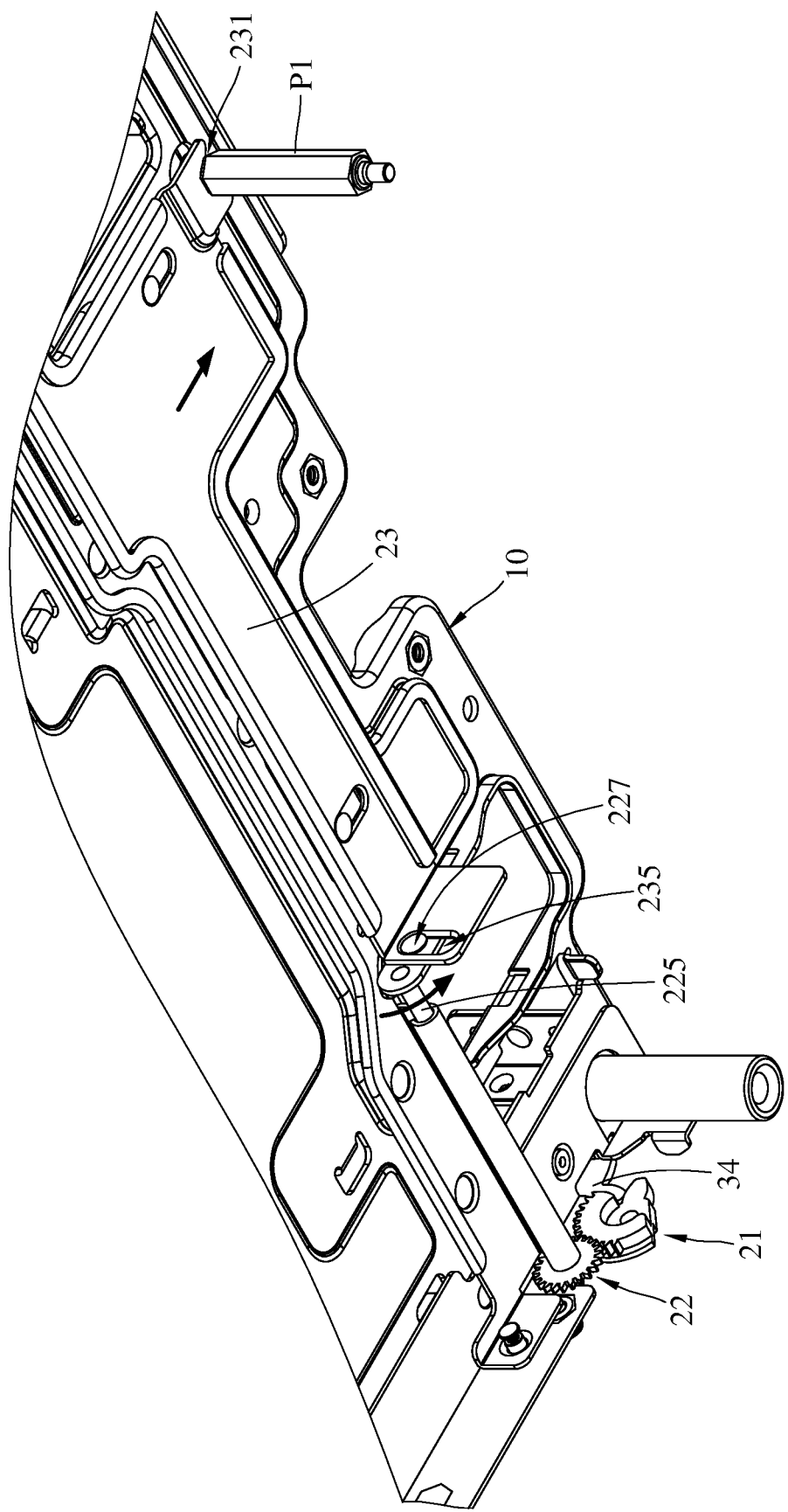
FIG. 12 is a partially enlarged perspective view of the casing assembly in FIG. 11.

The first component 21 is connected between the gear set 30 and the second component 22, and the second component 22 is connected between the first component 21 and the third component 23. The gear set 30 is able to move the third component 23 through the first component 21 and the second component 22. In this embodiment, the third component 23 is switchable between a releasing position (as shown in FIG. 10 discussed in later paragraphs) and an engaged position (as shown in FIG. 12 discussed in later paragraphs), thus a latching structure 231 of the third component 23 is releasably engaged with the first engaging component P1 of the carrier 90.

In more detail, in this embodiment, the first component 21 may be a double gear that has gears at both sides thereof, where the gears of the first component 21 may be in the same or different form and size. As shown, the first component 21 may include a first coupling portion 213 and a first actuating portion 215 respectively located at two opposite sides of the first component 21. The first coupling portion 213 and the first actuating portion 215 are, for example, two gears respectively located at two opposite surfaces of the first component 21. The first coupling portion 213 is configured to directly contact or engage with the gear set 30 and therefore is movable with the gear set 30. The first actuating portion 215 is configured to directly contact or engage with the second component 22 so as to move the second component 22. In one embodiment, the number of teeth of the first coupling portion 213 may be lesser than that of the first actuating portion 215, thus the ratio of their numbers of teeth helps reduce the effort that the gear set 30 is needed to move the first component 21 and other components connected to the first component 21.

In one embodiment, the second component 22 may include a second coupling portion 223. The second coupling portion 223 may be a gear suitable for directly meshing with the first actuating portion 215 of the first component 21. The second coupling portion 223 is rotatable with respect to the casing 10 about an axis AX (as shown in FIG. 6).

For the gear set 30 to be able move the third component 23 which is located away from the first component 21 at a specific distance, the second component 22 may further include an extension portion 225 and a second actuating portion 227. The extension portion 225 may be a shaft extending along the axis AX with a suitable length. The extension portion 225 is connected to and located between the second coupling portion 223 and the second actuating portion 227, so that the second coupling portion 223 and the second actuating portion 227 are spaced apart by a required distance while able to synchronically rotate. In this embodiment, the second component 22 is disposed on the casing 10 by the extension portion 225 of the second component 22 rotatably inserted through the fourth component 24. In other embodiments, the second component 22 may be disposed on the casing 10 by the extension portion 225 directly disposed on the casing 10.

The second actuating portion 227 indicates the part of the second component 22 used to connect and move the third component 23. The third component 23 may include at least one third coupling portion 235 located at one end of the third component 23. As shown, the third coupling portion 235 of the third component 23 may be a groove, and the second actuating portion 227 of the second component 22 may be a protrusion configured to be slidably inserted into the groove. In one embodiment, the second actuating portion 227 may be a suitable fastener, such as a bolt, a screw, or a rivet. In this embodiment, the second actuating portion 227 is not on the axis AX of the second coupling portion 223; in other words, the second actuating portion 227 and the axis AX of the second coupling portion 223 are not overlapping, and the second actuating portion 227 is rotatable about the axis AX of the second coupling portion 223. Thus, during the rotation of the second component 22 about the axis AX, the second actuating portion 227 is able to push the third coupling portion 235 so as to force the third component 23 to move in a direction substantially perpendicular to the axis AX.

To ensure the movable path of the third component 23, the third component 23 may further include at least one installing portion 233, the installing portion 233 may be a straight groove extending in a direction substantially perpendicular to the axis AX, a suitable fastener (not numbered) on the casing 10 or the fourth component 24, such as a bolt, a screw, or a rivet is slidable disposed through the installing portion 233, such that the third component 23 is movable in the direction substantially perpendicular to the axis AX so that the latching structure 213 of the third component 23 is movable towards or away from the first engaging component P1 of the carrier 90.

Accordingly, through the first coupling portion 213 and the first actuating portion 215 of the first component 21 and the second coupling portion 223, the extension portion 225, and the second actuating portion 227 of the second component 22, the gear set 30 is able to switch the third component 23 to the engaged position to engage with the first engaging component P1 or switch the third component 23 to the releasing position to release the first engaging component P1. Note that the forms of the latching structure of the third component and the first engaging component of the carrier may be modified as required, as long as the third component is able to latch the carrier when in the engaged position.

In this embodiment, the gear set 30 may include a plurality of gear members (e.g., a first gear member 31, a second gear member 32, a third gear member 33, and a fourth gear member 34). Note that the gear set 30 and the side cover 50 at the opposite sides of the casing 10 substantially have the same configuration; thus, only one gear set 30 and one side cover 50, that are located at one side of the casing 10, will be described in further detail in the following paragraphs.

The first gear member 31, the second gear member 32, the third gear member 33, and the fourth gear member 34 may be pivotally disposed on a side of the casing 10 located adjacent to the latch mechanism 20 in any suitable manner. The first gear member 31, the second gear member 32, the third gear member 33, and the fourth gear member 34 may each be rotatable about an axis that is substantially parallel to the axis of the first component 21 of the engagement mechanism 20. The first gear member 31 and the third gear member 33 are respectively meshed with two opposite sides of the second gear member 32. The second gear member 32 and the fourth gear member 34 are respectively meshed with two opposite sides of the third gear member 33. As shown, the first gear member 31, the second gear member 32, the third gear member 33, and the fourth gear member 34 are movable by each other and arranged in a line at one side of the casing 10.

In more details, in this embodiment, the first gear member 31 may have a first engagement portion 311, the first engagement portion 311 may be a curved groove extending along a curved line whose center of curvature overlaps an axis of the first gear member 31. As shown, the curved groove has an opening formed at an edge of the first gear member 31, and the curved groove is recessed inwardly from the opening and has a closed end opposite to the opening.

The second gear member 32 may include a gear portion 321 and an extension arm 322, the gear portion 321 is the part of the second gear member 32 being meshed with the first gear member 31 and the third gear member 33, the extension arm portion 322 extends away from the gear portion 321 in a direction away from the axis of the second gear member 32, the handle 40 is fixed to the second gear member 32 via the fixation to one end of the extension arm portion 322 so that the handle 40 is able to rotate the second gear member 32 and rotate other gear members via the second gear member 32. In this embodiment, the first gear member 31 may have a flat portion 312 (as shown in FIG. 3) at one side thereof to prevent interference with the extension arm portion 322 of the second gear member 32.

The third gear member 33 is substantially the same or similar to the gear portion 321 of the second gear member 32 and therefore is not repeatedly described herein. The fourth gear member 34 is substantially the same or similar to the first gear member 31, in other words, the first gear member 31 and the fourth gear member 34 share the same configuration, which is beneficial to reduce the development cost. Thus, similarly, the fourth gear member 34 may have a second engagement portion 341, the second engagement portion 341 may be a curved groove extending along a curved line whose center of curvature overlaps an axis of the fourth gear member 34. As shown, the curved groove has an opening formed at an edge of the fourth gear member 34, and the curved groove is recessed inwardly from the opening and has a closed end opposite to the opening.

Also, the fourth gear member 34 is the part of the gear set 30 used to directly contact and push the first component 21 of the latch mechanism 20. Thus, the fourth gear member 34 can be considered as a trigger or an actuating component for actuating the latch mechanism 20. Specifically, the first coupling portion 213 of the first component 21 is meshed with the teeth of the fourth gear member 34; in other words, the first coupling portion 213 of the first component 21 is located at the path of the teeth of the fourth gear member 34. Thus, the fourth gear member 34 is able to switch the third component 23 to the engaged position or the releasing position by turning the first component 21 and the second component 22.

Regarding the distribution of the teeth on the fourth gear member 34, there is a toothed area 342 and a toothless area 343 on an outer edge of the fourth gear member 34, the toothed area 342 means the area of the outer edge of the fourth gear member 34 with teeth while the toothless area 343 means the area of the outer edge of the fourth gear member 34 without teeth.

In this embodiment, the side cover 50 may be fixed to the casing 10 and located outside of the gear set 30 in any suitable manner, such that teeth of the first gear member 31, the second gear member 32, the third gear member 33, and the fourth gear member 34 are partially or almost located between the side cover 50 and the casing 10. This configuration prevents finger pinching caused by the gear set 30. The term "outside of the gear set" indicates the side of the gear set 30 opposite to or located away from the casing 10. In addition, corresponding to the first engagement portion 311 of the first gear member 31 and the second engagement portion 341 of the fourth gear member 34, the side cover 50 may have two guide holes 51 (as shown in FIG. 3). The guide holes 51 are recessed inwardly from an edge of the side cover 50 and therefore each has an opening at the edge of the side cover 50 and a closed end opposite to the opening. The guide holes 51 at least expose part of the first engagement portion 311 and part of the second engagement portion 341. However, the side covers 50 are optional and not intended to limit the disclosure.

The operation of the casing assembly 1 is described in detail hereinafter with further reference to FIGS. 7-12. Firstly, in FIGS. 7-8, the handle 40 can be pivoted to the standing position from the lying position as indicated by the arrow. When the handle 40 is in the standing position, the handle 40 is substantially perpendicular to the casing 10, allowing the user to grip and carry the casing assembly 1. In addition, during the movement of the handle 40 toward the standing position, the handle 40 rotates the extension arm portion 322 and the gear portion 321 of the second gear member 32 in the same direction, such that the handle 40 can simultaneously rotate the first gear member 31, the third gear member 33, and the fourth gear member 34 (as indicated by the arrows). By doing so, the second gear member 32 rotates the first gear member 31 and the fourth gear member 34 to a position where the openings of both the first engagement portion 311 and the second engagement portion 341 respectively correspond to the guide holes 51 of the side cover 50.

Figure 8:
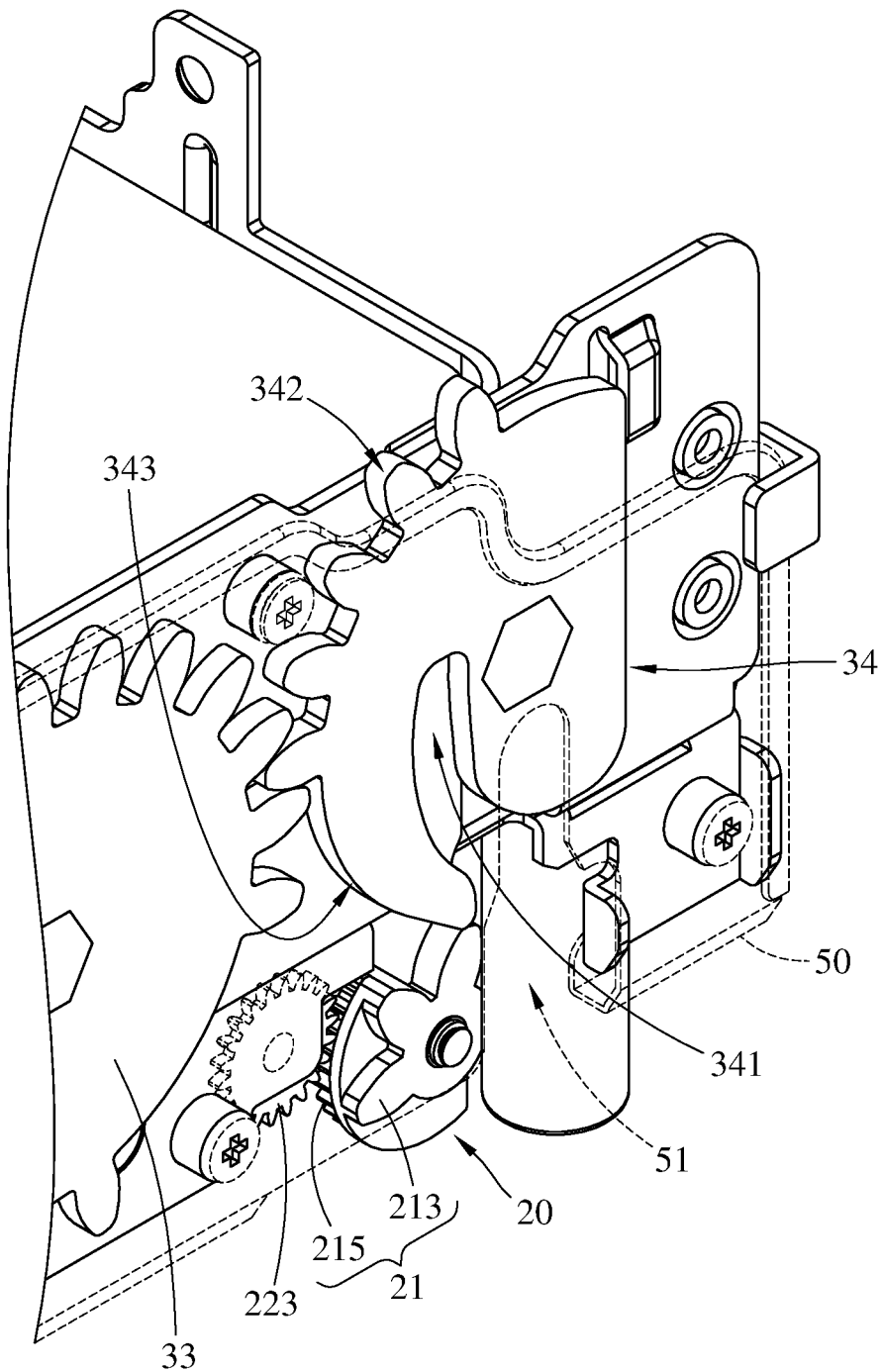
FIG. 8 is a partially enlarged perspective view of the casing assembly in FIG. 7.

Also, as shown in FIGS. 7-8, when the handle 40 reaches the standing position, the teeth of the fourth gear member 34 it not yet meshed with the first coupling portion 213 of the first component 21 of the latch mechanism 20; in other words, the first component 21 is located at the toothless area 343 and not yet meshed with the fourth gear member 34. At this moment, the first component 21 may be in a position in slight contact with or in no contact with the fourth gear member 34, thus the fourth gear member 34 is prevented from unexpectedly causing the first component 21 to move during the placement or removal of the casing assembly 1 and thereby ensuring that the first component 21 is in a position that keeps the third component 23 in the releasing position.

Then, as the broken lines shown in FIG. 7, the user can place the casing assembly 1 into the carrier 90 by holding the handle 40. To correctly place the casing assembly 1 into the carrier 90, the guide holes 51 of the side cover 50 may be aligned with the second engaging components P2 on the carrier 90. During the placement, the openings of both the first engagement portion 311 of the first gear member 31 and the second engagement portion 341 of the fourth gear member 34 correspond to the guide holes 51, thus, the second engaging components P2 can enter into the first engagement portion 311 and the second engagement portion 341 via these openings. Also, since the first component 21 keeps the third component 23 in the releasing position, the third component 23 is prevented from hitting or having interference with the first engaging components P1 of the carrier 90 during the placement of the casing assembly 1 into the carrier 90.

Figure 9:
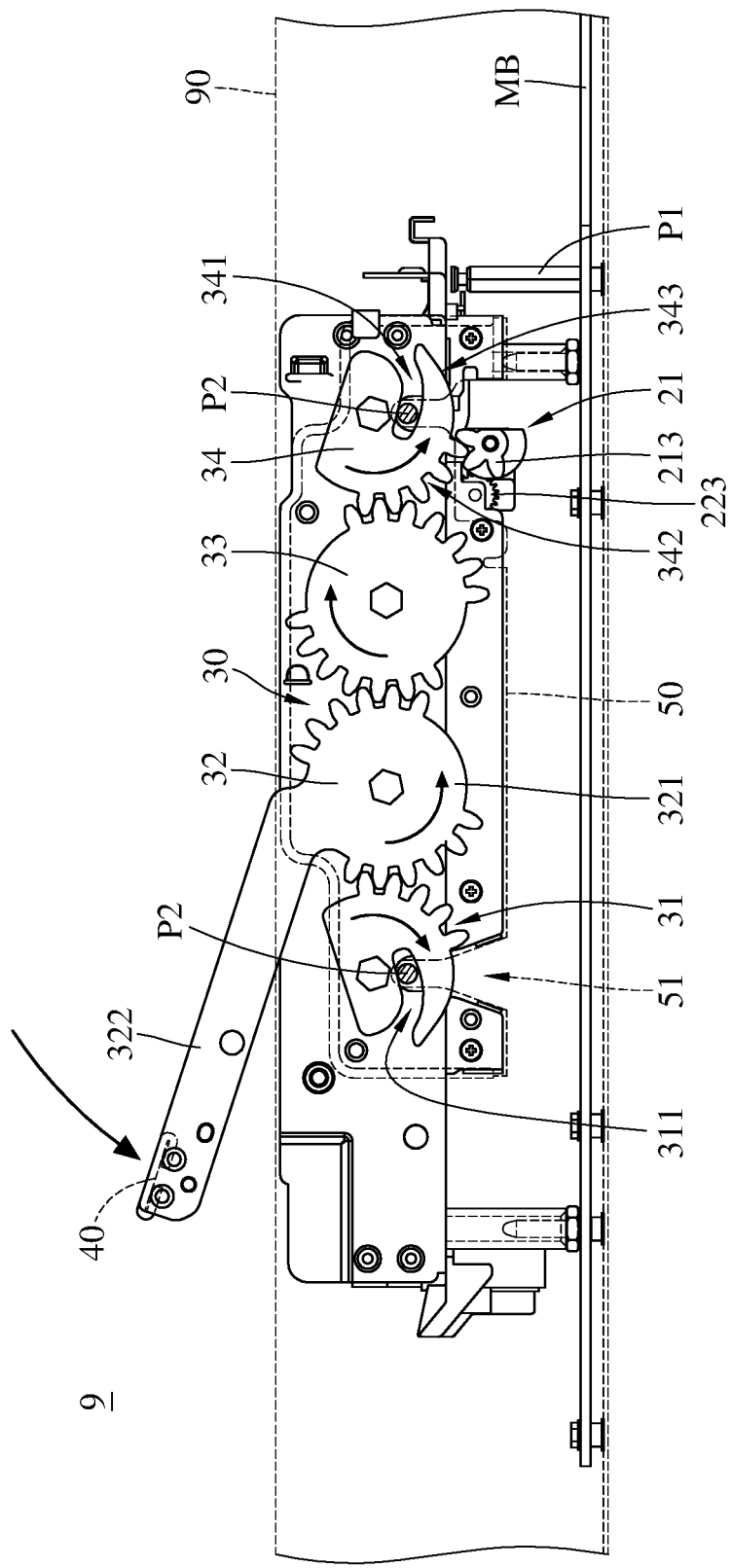
FIG. 9 is a side view of the electronic device according to one embodiment of the disclosure when the casing assembly is placed on the carrier and a handle of the casing assembly is pivoted towards a lying position by a specific angle.

Then, as indicated by the arrows shown in FIG. 9, after the casing assembly 1 is placed on the carrier 90, the handle 40 can be pivoted towards the lying position about, for example, 60-75 degrees. Before the handle 40 reaches the lying position and during the rotations of the first gear member 31 and the fourth gear member 34, the second engaging components P2 enter into the first engagement portion 311 and the second engagement portion 341 and move towards the closed ends of the first engagement portion 311 and the second engagement portion 341. Meanwhile, the fourth gear member 34 will reach a position that the toothless area 343 had slid over the first coupling portion 213 of the first component 21 and the toothed area 342 is preliminary meshing with the first coupling portion 213 but not yet causing the first coupling portion 213 to move. Thus, in FIG. 10, the third component 23 stays in the releasing position.

As discussed, the latching structure 231 of the third component 23 is kept separate from the first engaging component P1 before the handle 40 is pivoted over a specific angle from the standing position. This helps delay the effect that the handle 40 or the gear set 30 have on the latch mechanism 20 during the placement and removal of the casing assembly 1; in other words, only the late phase of the rotation of the handle 40 towards the lying position can cause the latch mechanism 20 to move. Thus, a short distance movement of the third component 23 is enough for it to engage with the first engaging component P1. In short, with the cooperation of the toothless area 343 of the fourth gear member 34 and the first component 21, the distance between the engaged position and the releasing position of the third component 23 may be short as possible, which is beneficial for the casing assembly 1 to be applied to a limiting space.

Then, in FIGS. 11-12, the handle 40 is pivoted to the lying position, thus the first gear member 31 and the fourth gear member 34 are rotated to let the second engaging components P2 reach the closed ends of the first engagement portion 311 and the second engagement portion 341. As such, the gear set 30 is able to firmly hook the second engaging components P2 of the carrier 90 via the first gear member 31 and the fourth gear member 34 so as to secure the installation of the casing assembly 1 on the carrier 90. With the cooperation of the second engaging components P2 and the first engagement portion 311 and the second engagement portion 341, the casing assembly 1 is ensured to be installed into the carrier 90 along a predetermined direction and path, thereby making the connector of the circuit board CB precisely aligned with and connected to the connector of the mainboard MB.

Meanwhile, the toothed area 342 of the fourth gear member 34 turns the first component 21 of the latch mechanism 20 so as to cause the third component 23 to slide towards the engaged position and engaged with the first engaging components P1 of the carrier 90 with its latching structures 231. By doing so, the installation of the casing assembly 1 is completed. As a result, except for two opposite sides of the casing assembly 1 being supported by the gear sets 30, other areas of the casing assembly 1 obtains support from the carrier 90 as well, which stabilize the installation of the casing assembly 1 and secure the electrical connection between the circuit board CB and the mainboard MB.

On the other hand, the removal of the casing assembly 1 can be easily implemented by reversely following the above steps. In specific, the handle 40 can be switched back to the standing position, so that the gear sets 30 and the third component 23 are forced to move away from the first engaging components P1 and the second engaging components P2 of the carrier 90, thereby allowing the casing assembly 1 to be removed from the carrier 90.

As discussed, the installation and removal of the casing assembly 1 can be realized in an efficient and toolless manner simply by operating the handle 40 thereof and therefore the casing assembly 1 is beneficial to improve the efficiency of maintenance or relevant works. Also, two gear sets 30 provide four fixing points at different areas of the casing 10, which ensures or improves the reliability of the casing assembly 1.

Also, the latch mechanism 20 extends inwards from two opposite sides of the casing 10 to build a connection with the carrier 90, such that two opposite sides and other specific areas of the casing assembly 1 can be supported. This is beneficial to prevent the casing 10 from displaced or deformed due to impact, vibration, its weight or load thereon and thus ensuring the installation stability of the devices or modules being supported on the casing 10.

It is understood that the idle space remaining in the computer casing or server casing is generally narrow for the space utilization concern, thus the first component 21, the second component 22, and the third component 23 of the latch mechanism 20 are each basically in a thin shape so that the latch mechanism 20 is allowed to be arranged through a narrow periphery space along the surface of the casing 10 to reach a specific area of the casing 10 and create a connection with the carrier 90.

It is noted that the previous embodiments are exemplary. In other embodiments, only one side of the casing assembly has the aforementioned gear set and latch mechanism. In addition, the disclosure is not limited by the order of the gear members of the aforementioned gear set; in the gear set of some other embodiments, the first to fourth gear members may be arranged in another order as required.

It is also noted that the location of the latch mechanism and how to activate the latch mechanism may be changed or modified as required. The following provides casing assemblies of other embodiments of the disclosure, and only the main differences between the following embodiments and the previous embodiments will be described in detail, the same or similar part among embodiments can be comprehended with reference to the previous paragraphs. Also, the same reference numbers indicate the same components or structures. And part of each casing assembly may be depicted in broken lines for the purpose of clear illustration.

Figure 13:
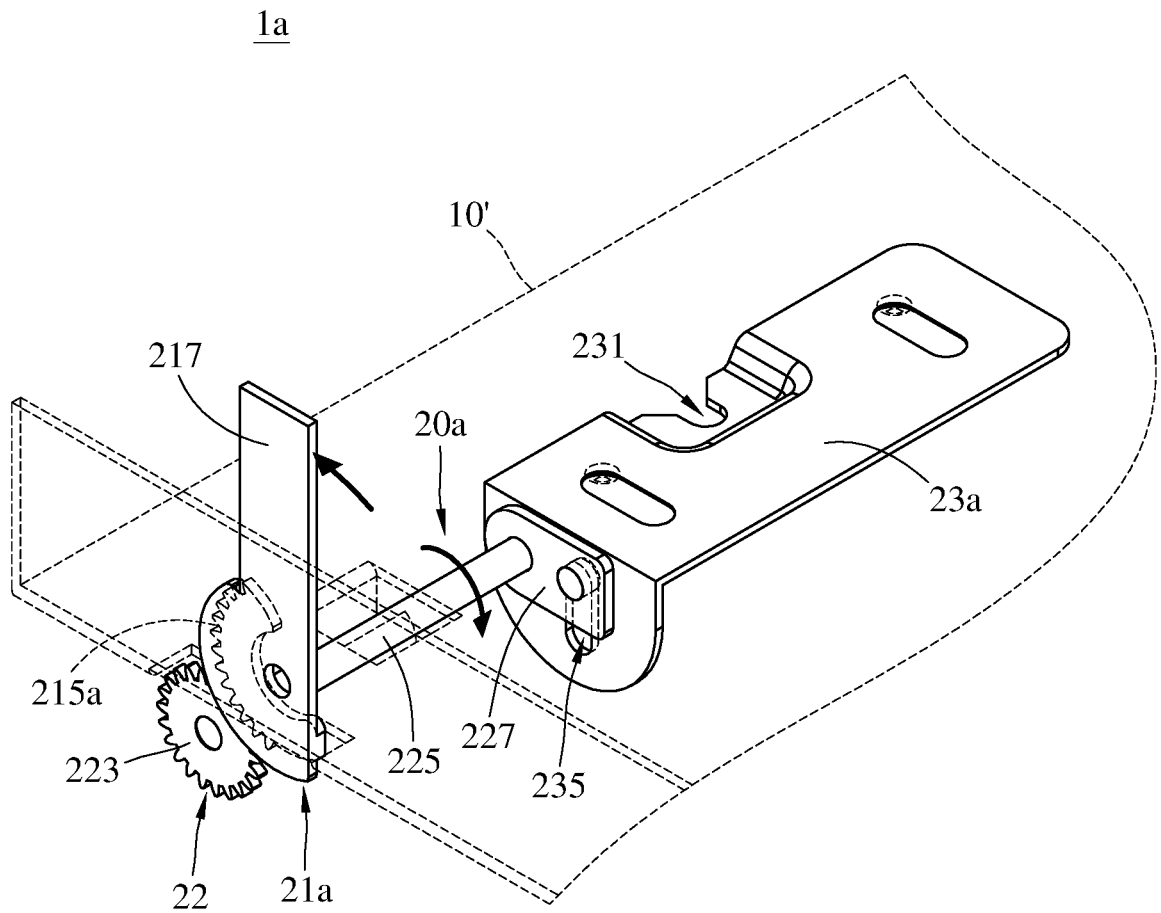
FIG. 13 is a partially enlarged perspective view of a casing assembly according to another embodiment of the disclosure.

Please refer to FIG. 13, another embodiment of the disclosure provides a casing assembly 1a including a casing 10' and a latch mechanism 20a, where the casing 10' may have the same or similar configuration as that of the casing in the previous embodiment, and the latch mechanism 20a includes a first component 21a having an operable plate portion 217 extending outwards from a first actuating portion 215a. In such an arrangement, the first actuating portion 215a of the first component 21a is able to rotate the second coupling portion 223 of the second component 22 when the user directly or indirectly moves the operable plate portion 217. And the rotation of the second component 22b rotates the extension portion 225 so as to cause the second actuating portion 227 to switch the third component 23a between the engaged position and the releasing position. Thus, the specific area of the casing 10' is also able to be engaged with a mating protrusion protruding from the peripheral structure (not shown).

Figure 14:
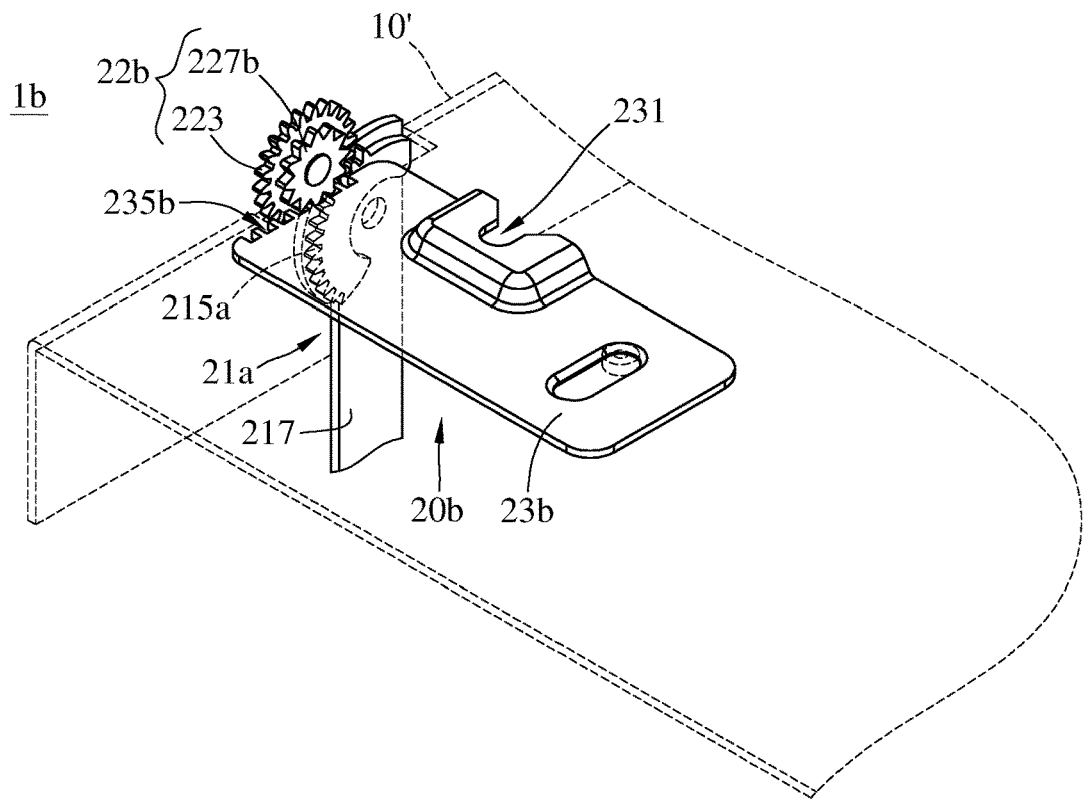
FIG. 14 is a partially enlarged perspective view of a casing assembly according to another embodiment of the disclosure.

Alternatively, please refer to FIG. 14, another embodiment of the disclosure provides a casing assembly 1b including a casing 10' and a latch mechanism 20b, where the latch mechanism 20b includes a second component 22b including a second coupling portion 223 and a second actuating portion 227b directly attached to each other, the second actuating portion 227b may be a gear located coaxially with the second coupling portion 223. In this case, the second component 22b may be a double gear with the second coupling portion 223 and the second actuating portion 227b respectively located at two opposite sides thereof, and the second component 22b occupies a small space since there is no extension portion. Correspondingly, the latch mechanism 20b includes a third component 23b having a third coupling portion 235b being a plurality of gear slots arranged in a line and located adjacent to an edge of the third component 23b and engageable with the second actuating portion 227b. When the user operates the first component 21a, the first actuating portion 215a rotates the second coupling portion 223 and the second actuating portion 227b so as to switch the third component 23b to the engaged position or the releasing position.

Figure 15:
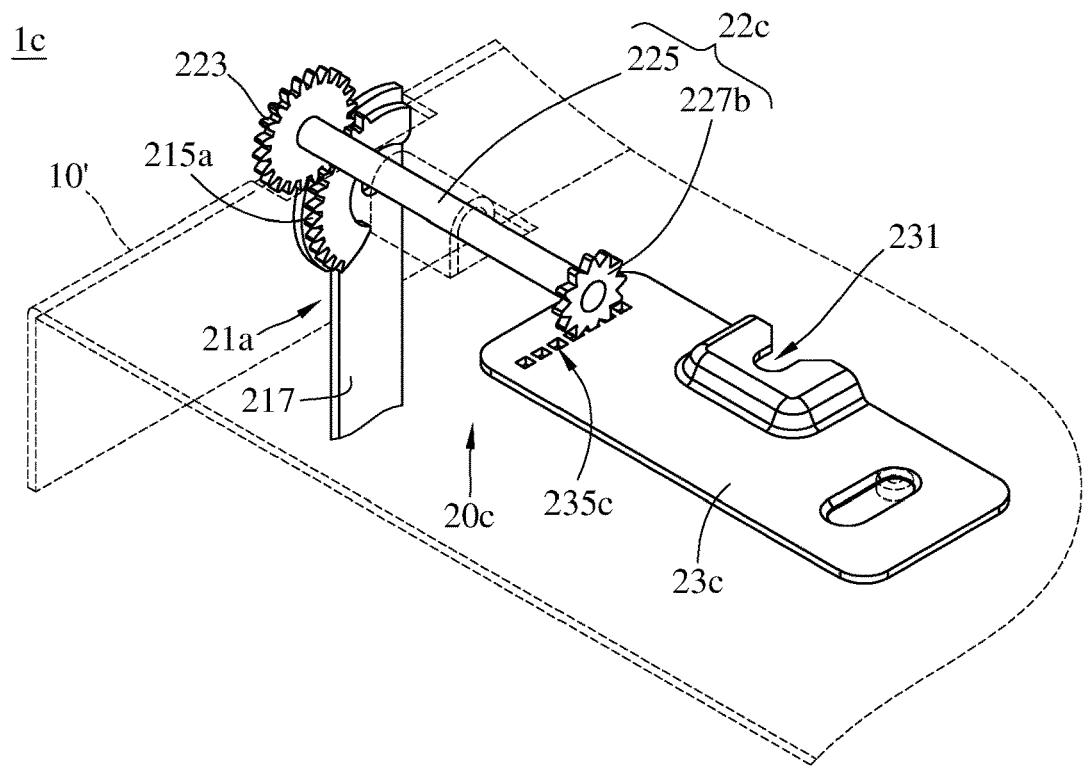
FIG. 15 is a partially enlarged perspective view of a casing assembly according to another embodiment of the disclosure.
Figure 16:
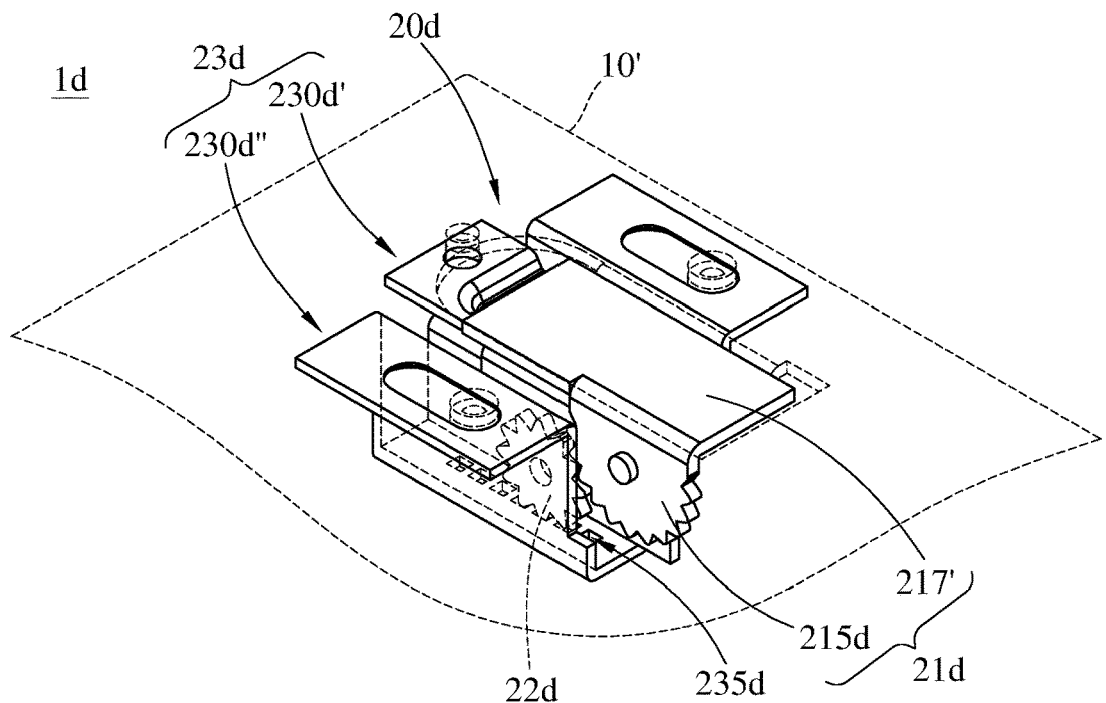
FIG. 16 is a partially enlarged perspective view of a casing assembly according to another embodiment of the disclosure.
Figure 17:
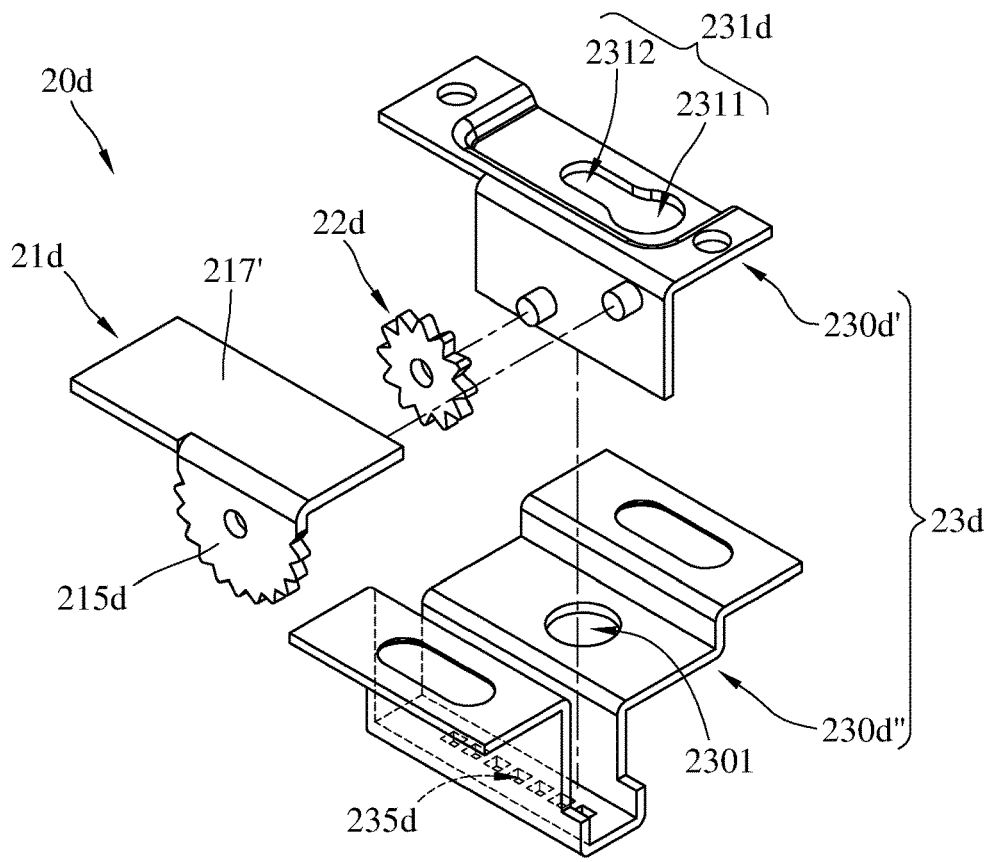
FIG. 17 is an exploded view of the casing assembly in FIG. 16.

Alternatively, please refer to FIG. 15, another embodiment of the disclosure provides a casing assembly 1c including a casing 10' and a latch mechanism 20c, where the latch mechanism 20c includes a first component 21a, a second component 22c, and a third component 23c. The second component 22c includes a second coupling portion 223, a second actuating portion 227b, and an extension portion 225 located between the second coupling portion 223 and the second actuating portion 227b. The third component 23c has a third coupling portion 235c being a plurality of holes arranged in a line and located adjacent to an edge of the third component 23c and engageable with the second actuating portion 227b. When the user operates the first component 21a, the first actuating portion 215a rotates the second coupling portion 223, the extension portion 225, and the second actuating portion 227b so as to switch the third component 23c to the engaged position or the releasing position.

Alternatively, please refer to FIGS. 16-19, one embodiment of the disclosure provides a casing assembly id including a casing 10' and a latch mechanism 20d. For example, the casing 10' may be a cover removably disposed on a carrier 90'. The latch mechanism 20d includes a first component 21d, a second component 22d, and a third component 23d. The first component 21d may include a first actuating portion 215d and an operable plate portion 217' at an angle (e.g., 90 degrees) to the first actuating portion 215d, the second component 22d may be a gear, the third component 23d may include a mount part 230d' and a movable part 230d'' movable with respect to each other.

The first actuating portion 215d of the first component 21d and the second component 22d are meshed with each other, and the first actuating portion 215d and the second component 22d are rotatably disposed on the mount part 230d' of the third component 23d. The mount part 230d' is fixed on the casing 10' in any manner. The mount part 230d' may have a latching structure 231d suitable for releasably engaging with the first engaging component P1. As shown, the latching structure 231d may be but not limited to be a through hole including a wide hole portion 2311 and a narrow hole portion 2312 connected to each other. The movable part 230d'' is slidably disposed on the casing 10'. The movable part 230d'' may have a third coupling portion 235d being a plurality of holes arranged in a line and engageable with the second component 22d. In addition, the movable part 230d'' may further have a through hole 2301 corresponding to the latching structure 231d of the mount part 230d' and configured for the insertion of the first engaging component P1.

Figure 18:
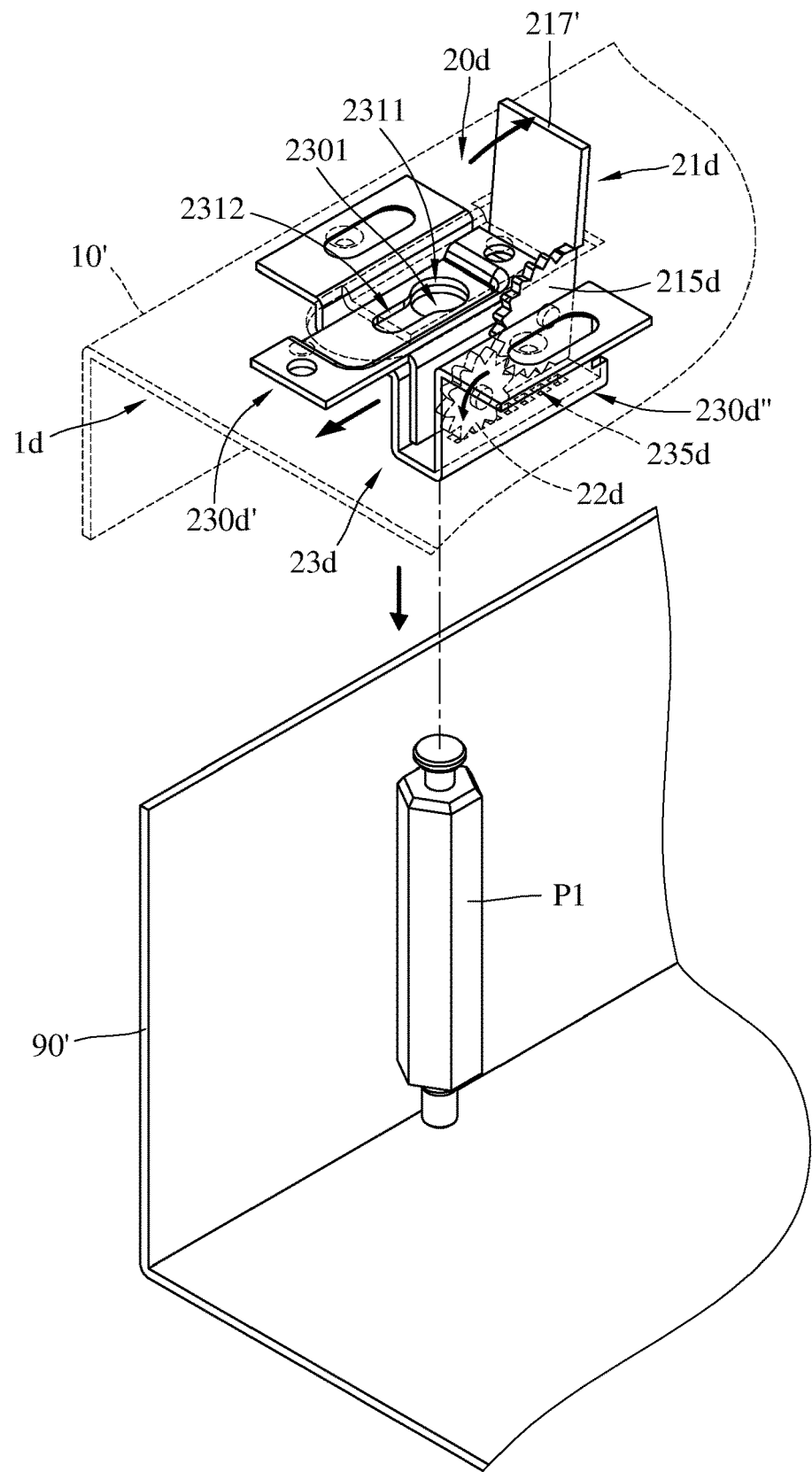
FIGS. 18-19 depict the operation of the casing assembly in FIG. 16.

In such an arrangement, as shown in FIG. 18, opening the first component 21d also causes the second component 22d to rotate, such that the second component 22d moves along the third coupling portion 235d, and the movable part 230d'' is moved relative to the mount part 230d' and the casing 10', and the through hole 2301 of the movable part 230d'' is aligned with the wide hole portion 2311 of the latching structure 231d. By doing so, the first engaging component P1 is able to penetrate through the movable part 230d'' and the wide hole portion 2311 during the placement of the casing 10' on the carrier 90'.

Figure 19:
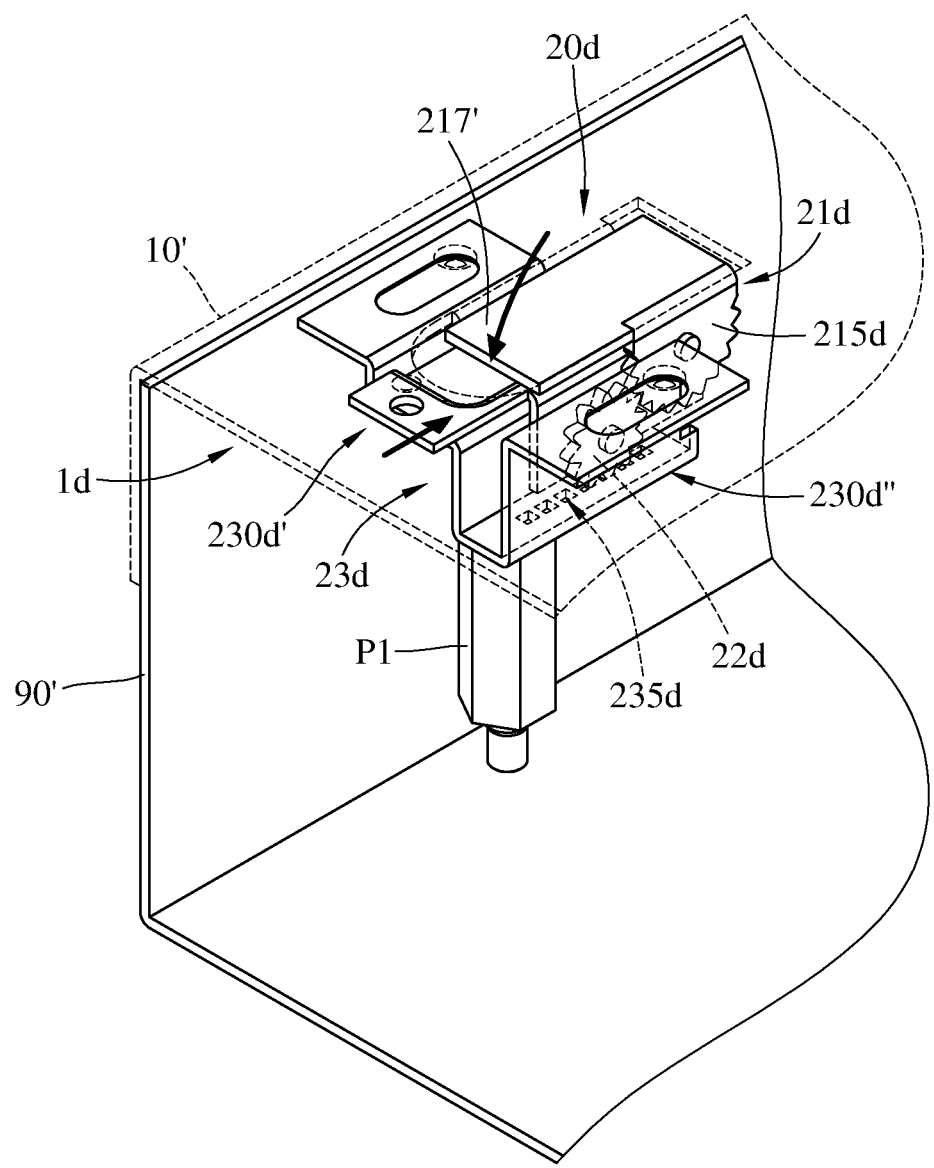

Then, in FIG. 19, the first component 21d is closed, the second component 22d is rotated along the third coupling portion 235d and moved towards one end of the third coupling portion 235d relatively close to the first actuating portion 215d of the first component 21d, thus, the second component 22d forces the mount part 230d' to move as indicated by the arrow, causing the first engaging component P1 to enter into the narrow hole portion 2312 of the latching structure 231d to engage with the mount part 230d'; that is, the casing 10' is fixed at the carrier 90'.

As discussed, the latch mechanisms of the aforementioned embodiments are able to build fixations from specific areas of one casing to the peripheral casing due to the configurations of the first to third components thereof. However, the disclosure is not limited by the design and arrangement of the first to third components of the latch mechanism, on the contrary, the latch mechanisms may be modified and adjusted or involve more suitable components as required.

According to the casing assembly and the electronic device as discussed in the above embodiments of the disclosure, switching the handle to the lying position can cause the gear set to make the first engagement portion engage with the carrier, and switching the handle back to the standing position can cause the gear to make the first engagement portion cancel the engagement with the carrier; that is, the latch mechanism makes the installation and removal of the casing assembly easily implemented by operating the handle. As such, the latch mechanism is able to make the associated maintenance, component replacement, and testing more efficient and convenient.

Also, in the latch mechanism, since the first component is able to cause the third component to engage with the first engaging component of the carrier by moving the second component, the second and third components can be served as an extension for the motion of the first component. This allows the user to operate the first component at a reachable location to cause the third component that is not reachable by fingers to build a connection with the carrier, thereby providing a specific area of the casing with a support from the carrier. As such, the latch mechanism not only enables an efficient and tooleless installation and removal of the casing but is also beneficial to prevent the casing from displaced or deformed due to impact, vibration, its weight or load thereon, thereby achieving a convenient operation while ensuring the installation stability of the devices or modules being supported on the casing.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly, adapted for a carrier, comprising:
a casing adapted to be stacked on the carrier; and
a latch mechanism comprising a first component, a second component, and a third component, wherein the first component and the second component are movable by each other and are rotatably disposed on one side of the casing, the third component is disposed on another side of the casing and linearly and slidably movable by the second component, and the third component is linearly and straightly engaged with a first engaging component of the carrier as the first component moves the second component;

wherein the casing assembly further comprises a plurality of gear members and a handle, the handle is rotatably connected to the casing via the plurality of gear members and has a lying position and a standing position; when the handle is in the lying position, one of the plurality of gear members is engaged with the first component; and the first component and the second component cause the third component to engage with the first engaging component: when the handle is in the standing position, the first component and the second component cause the third component to be released from the first engaging component.

2. The casing assembly according to claim 1, wherein the plurality of gear members comprise a first gear member and a second gear member which are meshed with each other, the handle is connected to the casing via the second gear member and is movable with the first gear member, the first gear member has a first engagement portion; when the handle is in the lying position, the handle causes the first engagement portion to engage with one of at least one second engaging component of the carrier.

3. The casing assembly according to claim 2, wherein the plurality of gear members further comprise a third gear member and a fourth gear member, the first gear member and the third gear member are respectively meshed with two opposite sides of the second gear member, the second gear member and the fourth gear member are respectively meshed with two opposite sides of the third gear member, the fourth gear member has a toothed area and a toothless area on an outer edge thereof; when the handle is in the standing position, the first component of the latch mechanism is located at the toothless area of the fourth gear member and is not meshed with the fourth gear member; when the handle is in the lying position, the toothed area of the fourth gear member is meshed with the first component and causes the third component to engage with the first engaging component of the carrier.

4. The casing assembly according to claim 3, wherein the fourth gear member has a second engagement portion; when the handle is in the lying position, the handle causes the second engagement portion of the fourth gear member to engage with another one of the at least one second engaging component of the carrier.

5. The casing assembly according to claim 1, wherein the first component comprises a first coupling portion and a first actuating portion respectively located at two opposite sides of the first component, the second component comprises a second coupling portion, an extension portion, and a second actuating portion, the first coupling portion is connected to one of the plurality of gear members, the first actuating portion is meshed with the second coupling portion of the second component, the extension portion is connected to and located between the second coupling portion and the second actuating portion, the extension portion extends along an axis of the second coupling portion, the second actuating portion is connected to and configured to move the third component, and the second actuating portion is not on the axis of the second coupling portion.

6. The casing assembly according to claim 1, wherein the first component comprises a first actuating portion and an operable plate portion extending outward from the first actuating portion, the second component comprises a second coupling portion, an extension portion, and a second actuating portion, the first actuating portion is meshed with the second coupling portion of the second component, the extension portion is connected to and located between the second coupling portion and the second actuating portion, the extension portion extends along an axis of the second coupling portion, the third component is movably connected to the second actuating portion and is movable by the second actuating portion, and the second actuating portion is not on the axis of the second coupling portion.

7. The casing assembly according to claim 1, wherein the first component comprises a first actuating portion and an operable plate portion extending outward from the first actuating portion, the second component comprises a second coupling portion and a second actuating portion, the third component comprises a third coupling portion, the first actuating portion is meshed with the second coupling portion of the second component, the second component is meshed with the third coupling portion of the third component via the second actuating portion, the third coupling portion is a plurality of gear slots arranged in a line and engageable with the second component.

8. The casing assembly according to claim 7, wherein the second component further comprises an extension portion connected to and located between the second coupling portion and the second actuating portion and extending along an axis of the second coupling portion.

9. The casing assembly according to claim 1, wherein the third component comprises a mount part and a movable part, the mount part is fixed to the casing and comprises a wide hole portion and a narrow hole portion connected to each other, the wide hole portion is configured to the first engaging component to be disposed therethrough, the narrow hole portion is configured for engaging with the first engaging component, the movable part is slidably disposed on the casing and has a through hole, the through hole is selectively corresponding to one of the wide hole portion and the narrow hole portion, the first component and the second component are rotatably disposed on the mount part, the movable part is movable by the second component and the first engaging component is movable between the wide hole portion and the narrow hole portion of the third component.

10. An electronic device, comprising:
a carrier with a first engaging component thereon; and
a casing assembly comprising:
a casing adapted to be stacked on the carrier; and
a latch mechanism comprising a first component, a second component, and a third component, wherein the first component and the second component are movable by each other and are rotatably disposed on one side of the casing, the third component is disposed on another side of the casing and linearly and slidably movable by the second component, and the third component is linearly and straightly engaged with the first engaging component of the carrier as the first component moves the second component;

wherein the casing assembly further comprises a plurality of gear members and a handle, the handle is rotatably connected to the casing via the plurality of gear members and has a lying position and a standing position; when the handle is in the lying position, one of the plurality of gear members is engaged with the first component; and the first component and the second component cause the third component to engage with the first engaging component; when the handle is in the standing position, the first component and the second component cause the third component to be released from the first engaging component.

11. The electronic device according to claim 10, wherein the plurality of gear members comprise a first gear member and a second gear member which are meshed with each other, the handle is connected to the casing via the second gear member and is movable with the first gear member, the first gear member has a first engagement portion; when the handle is in the lying position, the handle causes the first engagement portion to engage with one of at least one second engaging component of the carrier.

12. The electronic device according to claim 11, wherein the plurality of gear members further comprise a third gear member and a fourth gear member, the first gear member and the third gear member are respectively meshed with two opposite sides of the second gear member, the second gear member and the fourth gear member are respectively meshed with two opposite sides of the third gear member, the fourth gear member has a toothed area and a toothless area on an outer edge thereof; when the handle is in the standing position, the first component of the latch mechanism is located at the toothless area of the fourth gear member and is not meshed with the fourth gear member; when the handle is in the lying position, the toothed area of the fourth gear member is meshed with the first component and causes the third component to engage with the first engaging component of the carrier.

13. The electronic device according to claim 12, wherein the fourth gear member has a second engagement portion; when the handle is in the lying position, the handle causes the second engagement portion of the fourth gear member to engage with another one of the at least one second engaging component of the carrier.

14. The electronic device according to claim 10, wherein the first component comprises a first coupling portion and a first actuating portion respectively located at two opposite sides of the first component, the second component comprises a second coupling portion, an extension portion, and a second actuating portion, the first coupling portion is connected to one of the plurality of gear members, the first actuating portion is meshed with the second coupling portion of the second component, the extension portion is connected to and located between the second coupling portion and the second actuating portion, the extension portion extends along an axis of the second coupling portion, the second actuating portion is connected to and configured to move the third component, and the second actuating portion is not on the axis of the second coupling portion.

15. The electronic device according to claim 10, wherein the first component comprises a first actuating portion and an operable plate portion extending outward from the first actuating portion, the second component comprises a second coupling portion, an extension portion, and a second actuating portion, the first actuating portion is meshed with the second coupling portion of the second component, the extension portion is connected to and located between the second coupling portion and the second actuating portion, the extension portion extends along an axis of the second coupling portion, the third component is movably connected to the second actuating portion and is movable by the second actuating portion, and the second actuating portion is not on the axis of the second coupling portion.

16. The electronic device according to claim 10, wherein the first component comprises a first actuating portion and an operable plate portion extending outward from the first actuating portion, the second component comprises a second coupling portion and a second actuating portion, the third component comprises a third coupling portion, the first actuating portion is meshed with the second coupling portion of the second component, the second component is meshed with the third coupling portion of the third component via the second actuating portion, the third coupling portion is a plurality of gear slots arranged in a line and engageable with the second component.

17. The electronic device according to claim 16, wherein the second component further comprises an extension portion connected to and located between the second coupling portion and the second actuating portion and extending along an axis of the second coupling portion.

18. The electronic device according to claim 10, wherein the third component comprises a mount part and a movable part, the mount part is fixed to the casing and comprises a wide hole portion and a narrow hole portion connected to each other, the wide hole portion is configured to the first engaging component to be disposed therethrough, the narrow hole portion is configured for engaging with the first engaging component, the movable part is slidably disposed on the casing and has a through hole, the through hole is selectively corresponding to one of the wide hole portion and the narrow hole portion, the first component and the second component are rotatably disposed on the mount part, the movable part is movable by the second component and the first engaging component is movable between the wide hole portion and the narrow hole portion of the third component.

* * * * *